(12) United States Patent
Palaskas et al.

(10) Patent No.: US 7,653,147 B2
(45) Date of Patent: Jan. 26, 2010

(54) TRANSMITTER CONTROL

(75) Inventors: Georgios Palaskas, Portland, OR (US); Stewart S. Taylor, Beaverton, OR (US); Hasnain Lakdawala, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 632 days.

(21) Appl. No.: 11/206,447

(22) Filed: Aug. 17, 2005

(65) Prior Publication Data

US 2007/0041470 A1    Feb. 22, 2007

(51) Int. Cl.
  *H04L 25/03* (2006.01)
(52) U.S. Cl. .................................... 375/297; 375/295
(58) Field of Classification Search ................ 375/295, 375/296, 297; 327/291; 332/106; 341/173
  See application file for complete search history.

(56) References Cited

U.S. PATENT DOCUMENTS

| | | | | |
|---|---|---|---|---|
| 4,276,514 A * | 6/1981 | Huang | | 330/149 |
| 5,049,832 A * | 9/1991 | Cavers | | 330/149 |
| 5,249,201 A * | 9/1993 | Posner et al. | | 375/295 |
| 5,420,536 A * | 5/1995 | Faulkner et al. | | 330/149 |
| 5,655,220 A * | 8/1997 | Weiland et al. | | 455/69 |
| 5,724,003 A * | 3/1998 | Jensen et al. | | 330/129 |
| 5,923,215 A * | 7/1999 | Hans | | 330/149 |
| 5,923,712 A * | 7/1999 | Leyendecker et al. | | 375/297 |
| 5,959,499 A * | 9/1999 | Khan et al. | | 330/149 |
| 5,959,500 A * | 9/1999 | Garrido | | 330/151 |
| 6,043,707 A * | 3/2000 | Budnik | | 330/10 |
| 6,141,390 A * | 10/2000 | Cova | | 375/297 |
| 6,141,541 A * | 10/2000 | Midya et al. | | 455/91 |
| 6,157,253 A * | 12/2000 | Sigmon et al. | | 330/10 |
| 6,240,144 B1 * | 5/2001 | Ha | | 375/297 |
| 6,240,278 B1 * | 5/2001 | Midya et al. | | 455/126 |
| 6,246,286 B1 * | 6/2001 | Persson | | 330/149 |
| 6,252,915 B1 * | 6/2001 | Mollenkopf et al. | | 375/297 |
| 6,266,517 B1 * | 7/2001 | Fitzpatrick et al. | | 455/114.3 |
| 6,275,685 B1 * | 8/2001 | Wessel et al. | | 455/126 |
| 6,304,140 B1 * | 10/2001 | Thron et al. | | 330/149 |
| 6,370,364 B1 * | 4/2002 | Liimatainen | | 455/126 |
| 6,373,902 B1 * | 4/2002 | Park et al. | | 375/296 |
| 6,381,286 B1 * | 4/2002 | Wilkinson et al. | | 375/296 |

(Continued)

OTHER PUBLICATIONS

Palaskas et al., "A 5GHz Class-AB Power Amplifier in 90nm CMOS with Digitally-Assisted AM-PM Correction," IEEE 2005 Custom Integrated Circuits Conference, pp. 813-816, Communication Circuits Lab, Intel Corporation, Hillsboro, USA.

Wang et al., "A Nonlinear Capacitance Cancellation Technique and its Application to a CMOS Class AB Power Amplifier," 2001 IEEE Radio Frequency Integrated Circuits Symposium, pp. 39-42, MON2B-3, Center for Wireless Communications, University of California, San Diego, La Jolla, USA.

(Continued)

*Primary Examiner*—Temesghen Ghebretinsae
(74) *Attorney, Agent, or Firm*—Schwabe, Williamson & Wyatt, P.C.

(57) ABSTRACT

An apparatus for transmitter control is disclosed. The apparatus includes an analog circuit designed to operate on at least a portion of a communications signal to be wirelessly transmitted, based at least in part on a control signal. The apparatus includes a lookup table coupled to the analog circuit, with the lookup table designed to output the control signal based at least in part on the communications signal, or one or more measured metrics of the communications signal. Embodiments of the present invention include, but are not limited to, methods encompassing the operations described above, as well as subsystems and systems designed to operate in the above described manner.

25 Claims, 6 Drawing Sheets

U.S. PATENT DOCUMENTS

| | | | |
|---|---|---|---|
| 6,420,929 B1* | 7/2002 | Ha | 330/151 |
| 6,424,275 B1* | 7/2002 | Velazquez | 341/118 |
| 6,438,360 B1* | 8/2002 | Alberth et al. | 455/110 |
| 6,587,514 B1* | 7/2003 | Wright et al. | 375/296 |
| 6,600,369 B2* | 7/2003 | Mitzlaff | 330/149 |
| 6,600,792 B2* | 7/2003 | Antonio et al. | 375/297 |
| 6,614,854 B1* | 9/2003 | Chow et al. | 375/297 |
| 6,646,501 B1* | 11/2003 | Wessel | 330/10 |
| 6,654,426 B2* | 11/2003 | Lagerblom et al. | 375/296 |
| 6,670,849 B1* | 12/2003 | Damgaard et al. | 330/129 |
| 6,697,436 B1* | 2/2004 | Wright et al. | 375/296 |
| 6,731,693 B1* | 5/2004 | Damgaard | 375/296 |
| 6,774,719 B1* | 8/2004 | Wessel et al. | 330/136 |
| 6,775,330 B2* | 8/2004 | Bach et al. | 375/296 |
| 6,798,843 B1* | 9/2004 | Wright et al. | 375/296 |
| 6,798,844 B2* | 9/2004 | Ratto | 375/296 |
| 6,801,086 B1* | 10/2004 | Chandrasekaran | 330/140 |
| 6,801,581 B1* | 10/2004 | Francos et al. | 375/296 |
| 6,853,246 B2* | 2/2005 | Bauder et al. | 330/149 |
| 6,873,663 B1* | 3/2005 | Shipton | 375/329 |
| 6,882,221 B2* | 4/2005 | Schreyer et al. | 330/149 |
| 6,885,241 B2* | 4/2005 | Huang et al. | 330/149 |
| 6,900,693 B2* | 5/2005 | Sasho et al. | 330/133 |
| 6,928,122 B2* | 8/2005 | Opas et al. | 375/296 |
| 6,931,343 B2* | 8/2005 | Webster et al. | 702/107 |
| 6,937,669 B2* | 8/2005 | Tomerlin et al. | 375/297 |
| 6,940,919 B2* | 9/2005 | Myers | 375/296 |
| 6,949,976 B2* | 9/2005 | Funyu et al. | 330/149 |
| 6,975,167 B2* | 12/2005 | Saed | 330/149 |
| 6,975,687 B2* | 12/2005 | Jackson et al. | 375/297 |
| 6,982,594 B2* | 1/2006 | Snider et al. | 330/140 |
| 6,985,033 B1* | 1/2006 | Shirali et al. | 330/149 |
| 6,985,704 B2* | 1/2006 | Yang et al. | 455/126 |
| 6,993,091 B2* | 1/2006 | Ratto | 375/296 |
| 6,996,191 B1* | 2/2006 | Meditz | 375/308 |
| 6,999,737 B2* | 2/2006 | Ishihara | 455/126 |
| 7,023,273 B2* | 4/2006 | Johnson et al. | 330/149 |
| 7,026,872 B2* | 4/2006 | Saed | 330/149 |
| 7,030,693 B2* | 4/2006 | Honcharenko et al. | 330/149 |
| 7,034,613 B2* | 4/2006 | Saed | 330/149 |
| 7,035,345 B2* | 4/2006 | Jeckeln et al. | 375/296 |
| 7,043,213 B2* | 5/2006 | Robinson et al. | 455/127.2 |
| 7,058,369 B1* | 6/2006 | Wright et al. | 455/114.2 |
| 7,062,236 B2* | 6/2006 | Midtgaard et al. | 455/126 |
| 7,068,101 B2* | 6/2006 | Saed et al. | 330/149 |
| 7,072,421 B2* | 7/2006 | Bengtsson et al. | 375/298 |
| 7,085,330 B1* | 8/2006 | Shirali | 375/296 |
| 7,099,399 B2* | 8/2006 | McCallister | 375/269 |
| 7,113,037 B2* | 9/2006 | Nezami | 330/149 |
| 7,129,777 B2* | 10/2006 | Kim et al. | 330/149 |
| 7,133,649 B2* | 11/2006 | Kanazawa et al. | 455/91 |
| 7,139,327 B2* | 11/2006 | Vella-Coleiro et al. | 375/296 |
| 7,142,831 B2* | 11/2006 | Anvari | 455/114.2 |
| 7,145,962 B2* | 12/2006 | Lee | 375/296 |
| 7,146,138 B2* | 12/2006 | Anvari | 455/114.3 |
| 7,183,847 B2* | 2/2007 | Suzuki et al. | 330/149 |
| 7,194,043 B2* | 3/2007 | Ma | 375/296 |
| 7,197,085 B1* | 3/2007 | Vella-Coleiro | 375/296 |
| 7,200,188 B2* | 4/2007 | Fague et al. | 375/326 |
| 7,203,247 B2* | 4/2007 | Bauder et al. | 375/296 |
| 7,212,154 B2* | 5/2007 | Pennington | 342/202 |
| 7,212,584 B2* | 5/2007 | Hongo et al. | 375/297 |
| 7,212,791 B2* | 5/2007 | Arayashiki | 455/91 |
| 7,248,642 B1* | 7/2007 | Vella-Coleiro | 375/296 |
| 7,251,293 B2* | 7/2007 | Vella-Coleiro | 375/297 |
| 7,254,186 B2* | 8/2007 | Liu | 375/316 |
| 7,260,367 B2* | 8/2007 | McMorrow et al. | 455/108 |
| 7,266,159 B2* | 9/2007 | Vella-Coleiro | 375/296 |
| 7,269,231 B2* | 9/2007 | Ding et al. | 375/296 |
| 7,289,773 B2* | 10/2007 | Braithwaite | 455/91 |
| 7,333,561 B2* | 2/2008 | Pinckley et al. | 375/297 |
| 7,339,426 B2* | 3/2008 | Gurvich et al. | 330/136 |
| 7,346,122 B1* | 3/2008 | Cao | 375/296 |
| 7,346,317 B2* | 3/2008 | Rahman et al. | 455/126 |
| 7,353,006 B2* | 4/2008 | Gels et al. | 455/126 |
| 7,362,820 B2* | 4/2008 | Aman et al. | 375/297 |
| 7,372,918 B2* | 5/2008 | Muller et al. | 375/296 |
| 7,376,200 B2* | 5/2008 | Demir et al. | 375/296 |
| 2001/0026579 A1* | 10/2001 | Mollenkopf et al. | 375/141 |
| 2002/0015450 A1* | 2/2002 | Ratto | 375/261 |
| 2002/0018531 A1* | 2/2002 | Ratto | 375/297 |
| 2002/0024398 A1* | 2/2002 | Lagerblom et al. | 332/103 |
| 2002/0067773 A1* | 6/2002 | Jackson et al. | 375/308 |
| 2002/0101937 A1* | 8/2002 | Antonio et al. | 375/297 |
| 2002/0186783 A1* | 12/2002 | Opas et al. | 375/297 |
| 2002/0191710 A1* | 12/2002 | Jeckeln et al. | 375/296 |
| 2003/0058959 A1* | 3/2003 | Rafie et al. | 375/296 |
| 2003/0095608 A1* | 5/2003 | Duperray | 375/297 |
| 2003/0117215 A1* | 6/2003 | O'Flaherty et al. | 330/149 |
| 2003/0169829 A1* | 9/2003 | Vella-Coleiro | 375/296 |
| 2003/0179830 A1* | 9/2003 | Eidson et al. | 375/296 |
| 2003/0202615 A1* | 10/2003 | Bach et al. | 375/296 |
| 2003/0207680 A1* | 11/2003 | Yang et al. | 455/341 |
| 2003/0223508 A1* | 12/2003 | Ding et al. | 375/296 |
| 2003/0223509 A1* | 12/2003 | Ma | 375/296 |
| 2003/0227981 A1* | 12/2003 | Vella-Coleiro et al. | 375/297 |
| 2004/0061555 A1* | 4/2004 | Lynch | 330/136 |
| 2004/0105510 A1* | 6/2004 | Tomerlin et al. | 375/297 |
| 2004/0116083 A1* | 6/2004 | Suzuki et al. | 455/126 |
| 2004/0120420 A1* | 6/2004 | Hongo et al. | 375/297 |
| 2004/0203540 A1* | 10/2004 | Anvari et al. | 455/114.3 |
| 2004/0252784 A1* | 12/2004 | Honcharenko et al. | 375/297 |
| 2004/0264596 A1* | 12/2004 | Vella-Coleiro | 375/297 |
| 2004/0264597 A1* | 12/2004 | Vella-Coleiro | 375/297 |
| 2005/0001674 A1* | 1/2005 | Saed et al. | 330/149 |
| 2005/0001675 A1* | 1/2005 | Saed | 330/149 |
| 2005/0001676 A1* | 1/2005 | Saed | 330/149 |
| 2005/0018790 A1* | 1/2005 | Liu | 375/316 |
| 2005/0077960 A1* | 4/2005 | Kim et al. | 330/149 |
| 2005/0085198 A1* | 4/2005 | Anvari | 455/114.3 |
| 2005/0141639 A1* | 6/2005 | Anvari | 375/296 |
| 2005/0157813 A1* | 7/2005 | Cope et al. | 375/297 |
| 2005/0180527 A1* | 8/2005 | Suzuki et al. | 375/297 |
| 2005/0190857 A1* | 9/2005 | Braithwaite | 375/296 |
| 2006/0008027 A1* | 1/2006 | Gao et al. | 375/297 |
| 2006/0078065 A1* | 4/2006 | Cai et al. | 375/297 |
| 2006/0133536 A1* | 6/2006 | Rexberg | 375/297 |
| 2006/0188038 A1* | 8/2006 | Shako et al. | 375/296 |
| 2006/0209984 A1* | 9/2006 | Kenington | 375/297 |
| 2006/0262878 A1* | 11/2006 | Aman et al. | 375/297 |
| 2008/0130789 A1* | 6/2008 | Copeland et al. | 375/297 |

OTHER PUBLICATIONS

Kwan et al., "An Adaptive Analog Continuous-Time CMOS Biquadratic Filter," IEEE Journal of Solid-State Circuits, vol. 26, No. 6, Jun. 1991, pp. 859-867, USA.

Ravi et al., "A 1.4V, 2.4/5 GHz, 90nm CMOS System in a Package Transceiver for Next Generation WLAN," 2005 Symposium on VLSI Circuits Digest of Technical Papers, pp. 294-297, Intel Research and Development, Intel Corp., Hillsboro, USA.

Sowlati et al., "Phase-Correcting Feedback System for Class E Power Amplifier," IEEE Journal of Solid-State Circuits, vol. 32, No. 4, Apr. 1997, pp. 544-550, USA.

Sundstrom et al., "Effects of Reconstruction Filters in Digital Predistortion Linearizers for RF Power Amplifiers," IEEE Transactions on Vehicular Technology, vol. 44, No. 1, Feb. 1995, pp. 131-139, USA.

Sowlati et al., "A 2.4GHz 0.18mm CMOS self-biased cascade power amplifier," IEEE Journal of Solid-State Circuits, vol. 38, No. 8, Aug. 2003, pp. 1318-1324, USA.

* cited by examiner

TRANSMITTER CONTROL

FIELD

Disclosed embodiments of the present invention relate generally to the field of communications, and more particularly to transmitter control.

BACKGROUND

Transmitter circuits may encompass a number of analog circuits, such as, for example, amplifiers, mixers, filters, digital-to-analog converters, etc. One such type of analog circuit, amplifiers, may be used to amplify a communications signal before its transmission, and such amplifiers may include power amplifiers. There are a number of considerations in power amplifier design, including power efficiency and linearity. Linearity may refer to all input signals being amplified in substantially the same manner, so that the output signal is always, as near as possible, a linear function of the input signal. Different types of distortion that may occur in amplifiers include amplitude-dependent amplitude distortion and amplitude-dependent phase distortion. Other analog circuits in transmitter circuits may have a number of design issues.

BRIEF DESCRIPTION OF THE DRAWINGS

Embodiments of the invention are illustrated by way of example and not by way of limitation in the figures of the accompanying drawings, in which like references indicate similar elements and in which.

DETAILED DESCRIPTION OF ILLUSTRATIVE EMBODIMENTS

Embodiments of the present invention include, but are not limited to, an apparatus for transmitter control. The apparatus includes an analog circuit designed to operate on at least a portion of a communications signal to be wirelessly transmitted, based at least in part on a control signal. The apparatus includes a lookup table coupled to the analog circuit, with the lookup table designed to output the control signal based at least in part on the communications signal, or one or more measured metrics of the communications signal. Embodiments of the present invention include, but are not limited to, methods encompassing the operations described above, as well as subsystems and systems designed to operate in the above described manner. While portions of the following discussion may focus on particular analog circuits of a transmitter in describing various example embodiments, it is understood that the principles described herein may apply to other analog circuits of transmitter circuits, including but not limited to, amplifiers, mixers, filters, digital-to-analog converters, etc.

In the following description, various aspects of embodiments of the present invention will be described. However, it will be apparent to those skilled in the art that other embodiments may be practiced with only some or all of the described aspects. For purposes of explanation, specific numbers, materials and configurations are set forth in order to provide a thorough understanding of the embodiments. However, it will be apparent to one skilled in the art that other embodiments may be practiced without the specific details. In other instances, well-known features are omitted or simplified in order not to obscure the description.

Various operations will be described as multiple discrete operations in turn, in a manner that is most helpful in understanding the embodiments, however, the order of description should not be construed as to imply that these operations are necessarily order dependent. In particular, these operations need not be performed in the order of presentation.

The phrase "in some embodiments" is used repeatedly. The phrase generally does not refer to the same group of embodiments, however, it may. The phrase "in various embodiments" is used repeatedly. The phrase generally does not refer to the same group of embodiments, however, it may. The terms "comprising," "having" and "including" are synonymous, unless the context dictates otherwise.

Figure 1:
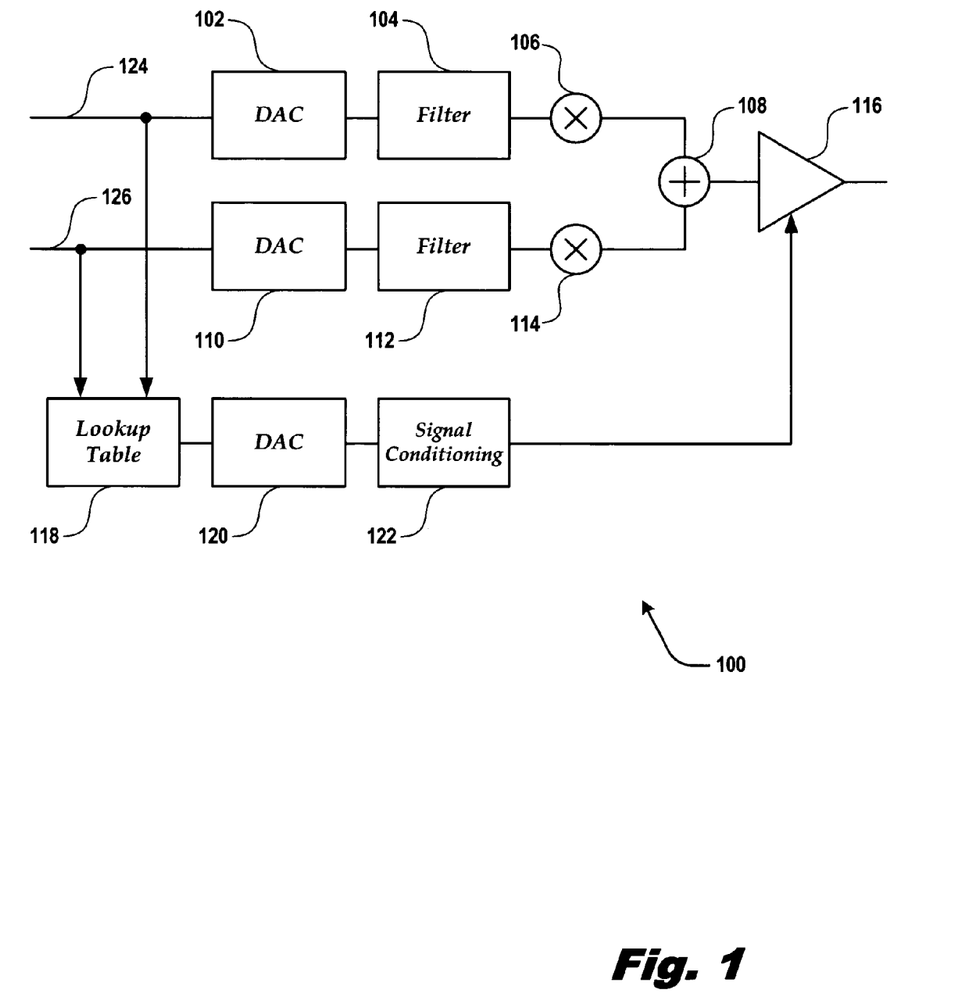
FIG. 1 is a block diagram illustrating some of the functional blocks of a circuit, in accordance with various embodiments of this invention.

FIG. 1 is a block diagram illustrating some of the functional blocks of circuit 100, in accordance with various embodiments of this invention. As illustrated, circuit 100 may include such components as digital-to-analog converters (DACs) 102 and 110, filters 104 and 112, mixers 106 and 114, and adder 108. Circuit 100 may include signal paths 124 and 126. In various embodiments, a different number of signal paths than as illustrated in FIG. 1 may be present. Signal paths 124 and 126 may relay one or more digital representations of a communications signal to be transmitted. In various embodiments, one signal path may relay the in-phase (I) portion of the communications signal and one signal path may relay the quadrature-phase (Q) portion of the communications signal. In other embodiments, the one or more signal paths may relay different representations of the communications signal.

Mixer 106 may serve to mix a baseband signal, which may at least partially be represented by the signal being relayed by signal path 124, with a carrier signal (not shown). Mixer 114 may likewise serve to mix a baseband signal, which may at least partially be represented by the signal being relayed by signal path 126, with a carrier signal (not shown). Adder 108 may serve to combine the two input signals being relayed by signal paths 124 and 126, after said mixing by mixers 106 and 114, respectively, into one signal to be amplified by amplifier 116.

Circuit 100 may include such components as lookup table 118, DAC 120, and signal conditioning circuit 122. While certain components have identical designations in FIG. 1, it is not implied that such components are identical, although they may be in some embodiments. Lookup table 118 may be coupled to amplifier 116 and may be designed to output a control signal to amplifier 116 based at least in part on the communications signal prior to its amplification. In various embodiments, lookup table 118 may receive as inputs, or as one input, a digital I/Q representation of the communications signal. In some embodiments, only a portion of the bits of a digital I or Q may be used in conjunction with lookup table 118. I and Q are used herein to mean both the entire representation of I and Q, respectively, or a portion of a representation of I and Q. In some embodiments, for example, a portion of a representation of I and Q may take the form of a certain number of the most significant bits (MSBs) of I and Q. In some embodiments, a portion of a representation of I and Q may take a different form.

In some embodiments, lookup table 118 may receive, or itself determine, a function of I and Q, such as, for example, the square root of $(I^2+Q^2)$. In some embodiments, lookup table 118 may receive, or itself determine, a different function of I and Q. In some embodiments, lookup table 118 may receive a function of additional or alternative values. In various other embodiments, lookup table 118 may receive a different digital representation of the communications signal as an input. In various other embodiments, lookup table 118 may receive an analog representation of the communications signal as an input. The contents of lookup table 118 may be determined in a number of ways, such as, for example, during the design stage of amplifier 116 using simulations. In various embodiments, the contents of lookup table 118 may be static. In various embodiments, the contents of lookup table 118 may be dynamic, such as shown in the illustrative embodiment of FIG. 4.

In various embodiments, DAC 120 may be coupled to the output of lookup table 118 in order to convert a digital output of lookup table 118 into analog form. In various embodiments, signal conditioning circuit 122 may facilitate the coupling of DAC 120 and amplifier 116. In various embodiments, signal conditioning circuit 122 may facilitate the coupling of lookup table 118 and amplifier 116. In some embodiments, signal conditioning circuit 122 may delay the signal supplied to its input to ensure proper timing of the application of the control signal to amplifier 116. In some embodiments, signal conditioning circuit 122 may additionally or alternatively smooth the signal supplied to its input, and may at least partially eliminate high frequency components. In some embodiments, signal conditioning circuit 122 may additionally or alternatively perform different signal conditioning functions on the signal supplied to its input. In some embodiments, signal conditioning circuit 122 may comprise a substantially similar filter as either filter 104 or 112, including comprising the same filter as either filter 104 or 112. In some embodiments, filters 104 and 112, and signal conditioning circuit 122, may comprise identical filters.

In various embodiments, the control signal supplied to amplifier 116 may comprise a bias control signal, such as, for example, a bias current or voltage. In some embodiments, the control signal supplied to amplifier 116 may comprise a bias voltage controlling a varactor (not shown) that may implement a signal-dependent phase-shift. In various embodiments, a bias voltage may be used in another manner. In various embodiments, a varactor may be used in another manner. In various embodiments, the control signal supplied to amplifier 116 may comprise another type of control signal. In various embodiments, amplifier 116 may comprise a power amplifier. In various embodiments, the symbol used for amplifier 116 may include a driver to amplifier 116. In some such embodiments, the control signal may be supplied to such a driver.

Figure 2:
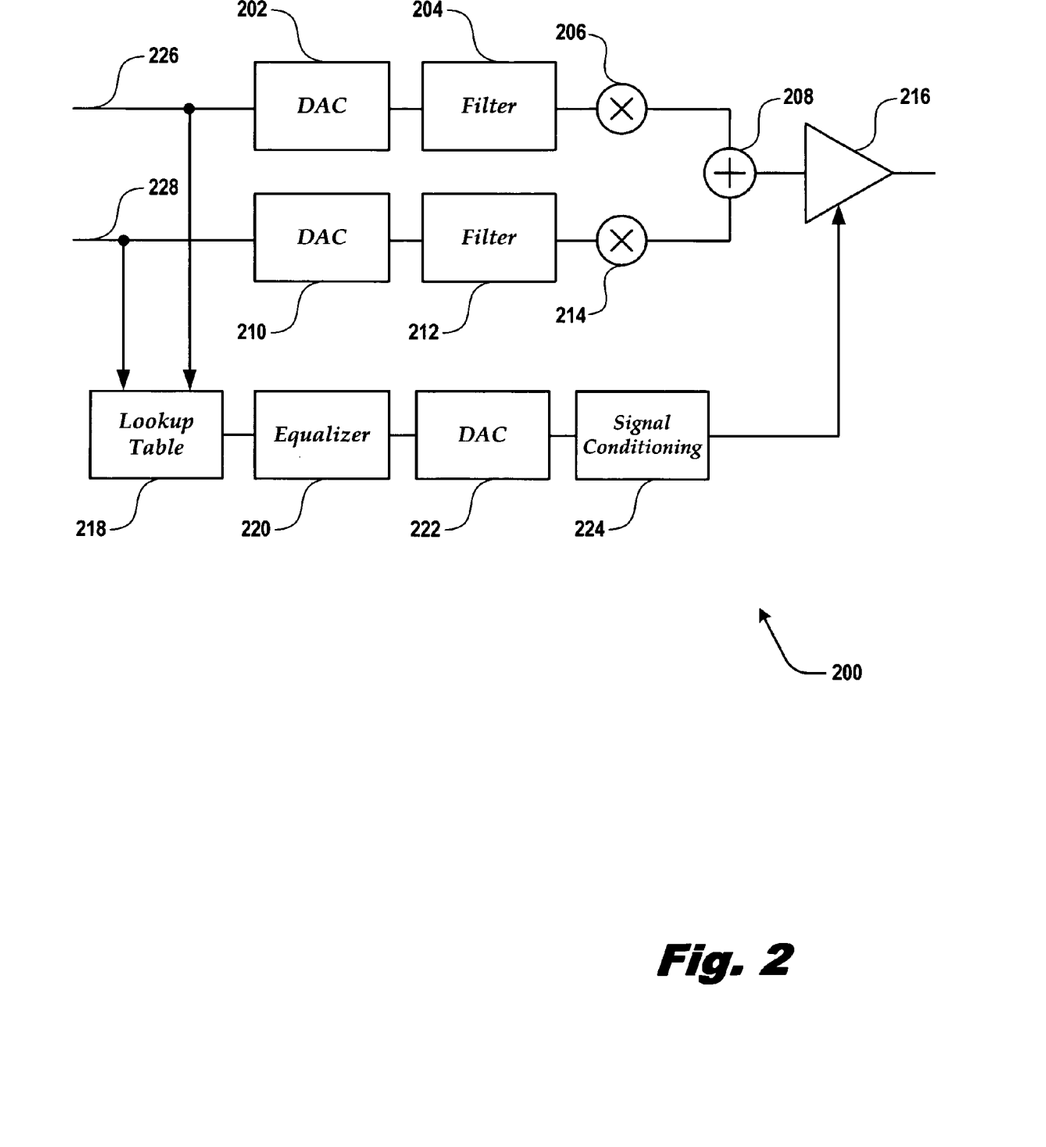
FIG. 2 is a block diagram illustrating some of the functional blocks of a circuit, in accordance with various embodiments of this invention.

FIG. 2 is a block diagram illustrating some of the functional blocks of circuit 200, in accordance with various embodiments of this invention. As illustrated, circuit 200 may include such components as DACs 202 and 210, filters 204 and 212, mixers 206 and 214, and adder 208. Circuit 200 may include signal paths 226 and 228. In various embodiments, a different number of signal paths than as illustrated in FIG. 2 may be present. Signal paths 226 and 228 may relay one or more digital representations of a communications signal. In various embodiments, one signal path may relay the I portion of the communications signal and one signal path may relay the Q portion of the communications signal. In other embodiments, the one or more signal paths may relay different representations of the communications signal.

Mixer 206 may serve to mix a baseband signal, which may at least partially be represented by the signal being relayed by signal path 226, with a carrier signal (not shown). Mixer 214 may likewise serve to mix a baseband signal, which may at least partially be represented by the signal being relayed by signal path 228, with a carrier signal (not shown). Adder 208 may serve to combine the two input signals being relayed by signal paths 226 and 228, after said mixing by mixers 206 and 214, respectively, into one signal to be amplified by amplifier 216.

Circuit 200 may include such components as lookup table 218, equalizer 220, DAC 222, and signal conditioning circuit 224. While certain components have identical designations in FIG. 2, it is not implied that such components are identical, although they may be in some embodiments. Lookup table 218 may be coupled to amplifier 216 and may be designed to output a control signal to amplifier 216 based at least in part on the communications signal prior to its amplification. In various embodiments, lookup table 218 may receive as inputs, or as one input, a digital I/Q representation of the communications signal. In some embodiments, only a portion of the bits of a digital I or Q may be used in conjunction with lookup table 218. I and Q are used herein to mean both the entire representation of I and Q, respectively, or a portion of a representation of I and Q. In some embodiments, for example, a portion of a representation of I and Q may take the form of a certain number of the MSBs of I and Q. In some embodiments, a portion of a representation of I and Q may take a different form.

In some embodiments, lookup table 218 may receive, or itself determine, a function of I and Q, such as, for example, the square root of $(I^2+Q^2)$. In some embodiments, lookup table 218 may receive a different function of I and Q as an input. In some embodiments, lookup table 218 may receive a function of additional or alternative values. In various other embodiments, lookup table 218 may receive a different digital representation of the communications signal as an input. In various other embodiments, lookup table 218 may receive an analog representation of the communications signal as an input. The contents of lookup table 218 may be determined in a number of ways, such as, for example, during the design stage of amplifier 216 using simulations. In various embodiments, the contents of lookup table 218 may be static. In various embodiments, the contents of lookup table 218 may be dynamic, such as shown in the illustrative embodiment of FIG. 4.

In various embodiments, equalizer 220 may be coupled to the output of lookup table 218 to compensate for at least one characteristic of a signal path. For example, in some embodiments, equalizer 220 may compensate for at least one characteristic of the portion of signal path 226 represented by the components of DAC 202, filter 204, mixer 206, and adder 208. In some embodiments, for example, the phase shift and/or the gain of the signal path may be at least partially compensated for by equalizer 220. In some embodiments, equalizer 220 may additionally or alternatively compensate for other characteristics of the signal path. In various embodiments, DAC 222 may be coupled to the output of equalizer 220 in order to convert a digital output of equalizer 220 into analog form.

In various embodiments, signal conditioning circuit 224 may facilitate the coupling of lookup table 218 and amplifier 216. In some embodiments, signal conditioning circuit 224 may delay the signal supplied to its input to ensure proper timing of the application of the control signal to amplifier 216. In some embodiments, signal conditioning circuit 224 may additionally or alternatively smooth the signal supplied to its input, and may at least partially eliminate high frequency components. In some embodiments, signal conditioning circuit 224 may additionally or alternatively perform different signal conditioning functions on the signal supplied to its input. In some embodiments, signal conditioning circuit 224 may facilitate the coupling of DAC 222 and amplifier 216. In some embodiments, signal conditioning circuit 224 may comprise a substantially similar filter as either filter 204 or 212, including comprising the same filter as either filter 204 or 212. In some embodiments, filters 204 and 212, and signal conditioning circuit 224, may comprise identical filters. In some embodiments, equalizer 220 may be the only component serving to facilitate the coupling of lookup table 218 and amplifier 216. In some embodiments, equalizer 220 may perform the same or substantially the same functions as signal conditioning circuit 224, and in some such embodiments, circuit 200 may not include signal conditioning circuit 224. In some embodiments, equalizer 220 may be coupled to the output of lookup table 218. In some embodiments, equalizer 220 may be coupled to the input of lookup table 218. In some embodiments, there may be an equalizer both at the input and at the output of lookup table 218.

In various embodiments, the control signal supplied to amplifier 216 may comprise a bias control signal, such as, for example, a bias current or voltage. In some embodiments, the control signal supplied to amplifier 216 may comprise a bias voltage controlling a varactor (not shown) that may implement a signal-dependent phase-shift. In various embodiments, a bias voltage may be used in another manner. In various embodiments, a varactor may be used in another manner. In various embodiments, the control signal supplied to amplifier 216 may comprise another type of control signal. In various embodiments, amplifier 216 may comprise a power amplifier. In various embodiments, the symbol used for amplifier 216 may include a driver to amplifier 216. In some such embodiments, the control signal may be supplied to such a driver.

Figure 3:
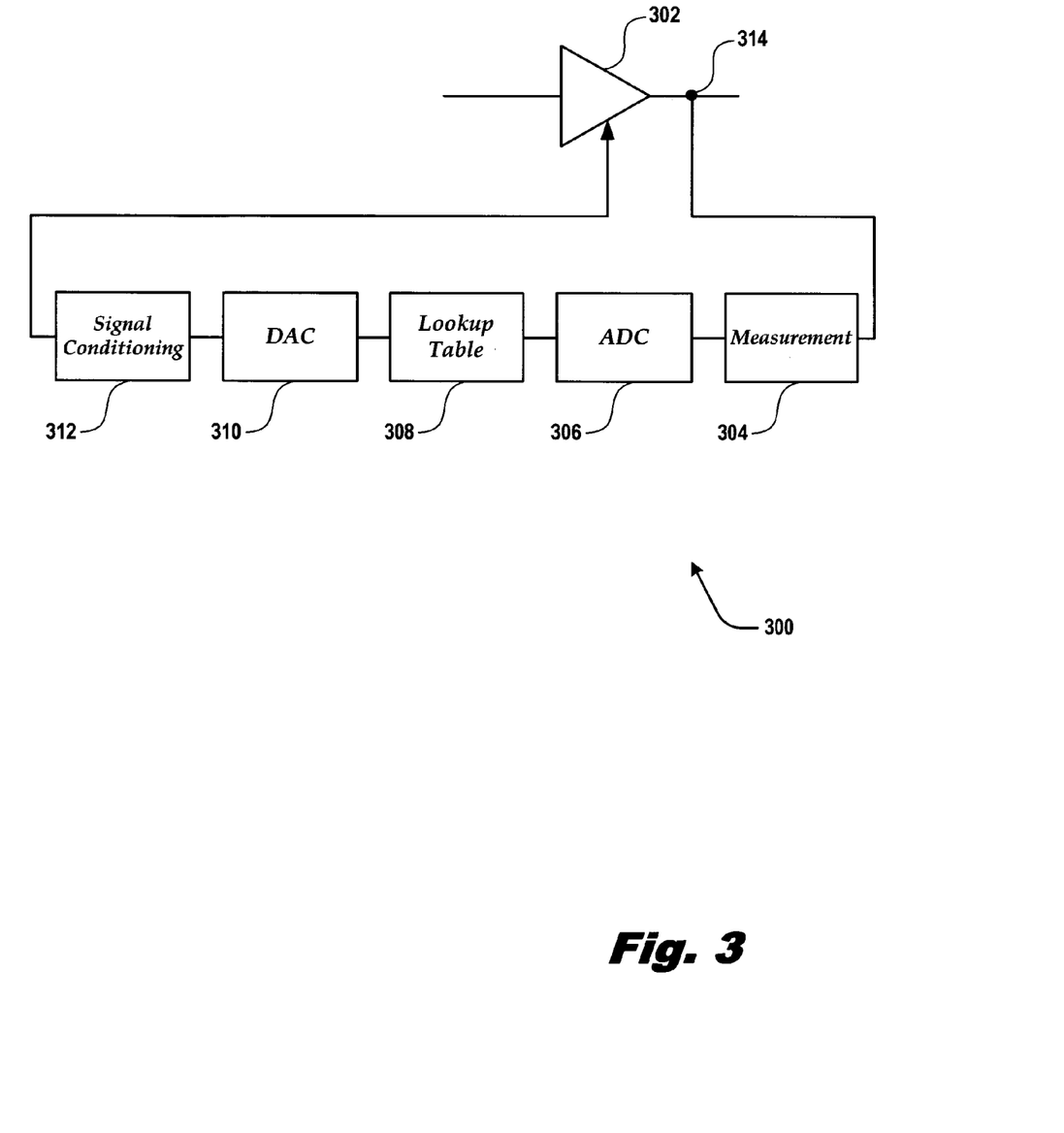
FIG. 3 is a block diagram illustrating some of the functional blocks of a circuit, in accordance with various embodiments of this invention.

FIG. 3 is a block diagram illustrating some of the functional blocks of circuit 300, in accordance with various embodiments of this invention. As illustrated, circuit 300 may include such components as amplifier 302, measurement circuit 304, analog-to-digital (ADC) converter 306, lookup table 308, DAC 310, and signal conditioning circuit 312. In various embodiments, measurement circuit 304 may measure one or more metrics of a communications signal. In some embodiments, such measurement may occur after the communications signal has been amplified by amplifier 302, such as, for example, at node 314. In some embodiments, such measurement may occur at a point (not shown) before the communications signal is supplied to amplifier 302. In some embodiments, such measurement may occur at an intermediate point (not shown) between the input and output of amplifier 302.

In various embodiments, measurement circuit 304 may be coupled to ADC 306 and may be designed to supply ADC 306 with one or more measured metrics of the communications signal in analog form. In some embodiments, measurement circuit 304 may comprise a power-meter. In some embodiments, measurement circuit 304 may comprise additional or alternative types of measurement circuitry. In various embodiments, ADC 306 may be coupled to measurement circuit 304 and may be designed to supply lookup table 308 with one or more metrics of the communications signal in digital form.

Circuit 300 may also include such components as lookup table 308, DAC 310, and signal conditioning circuit 312. Lookup table 308 may be coupled to amplifier 302 and may be designed to output a control signal to amplifier 302 based at least in part on one or more measured metrics of the communications signal. In various embodiments, lookup table 308 may receive as inputs, or as one combined input, one or more measured metrics of the communications signal. In some embodiments, only a portion of the one or more measured metrics may be used in conjunction with lookup table 308. In some embodiments, lookup table 308 may receive a function of at least the one or more measured metrics.

In various embodiments, signal conditioning circuit 312 may facilitate the coupling of lookup table 308 and amplifier 302. In some embodiments, signal conditioning circuit 312 may smooth the signal supplied to its input, and may at least partially eliminate high frequency components. In some embodiments, signal conditioning circuit 312 may additionally or alternatively perform different signal conditioning functions on the signal supplied to its input. In various embodiments, the symbol used for amplifier 302 may include a driver to amplifier 302. In some such embodiments, the control signal may be supplied to such a driver.

Figure 4:
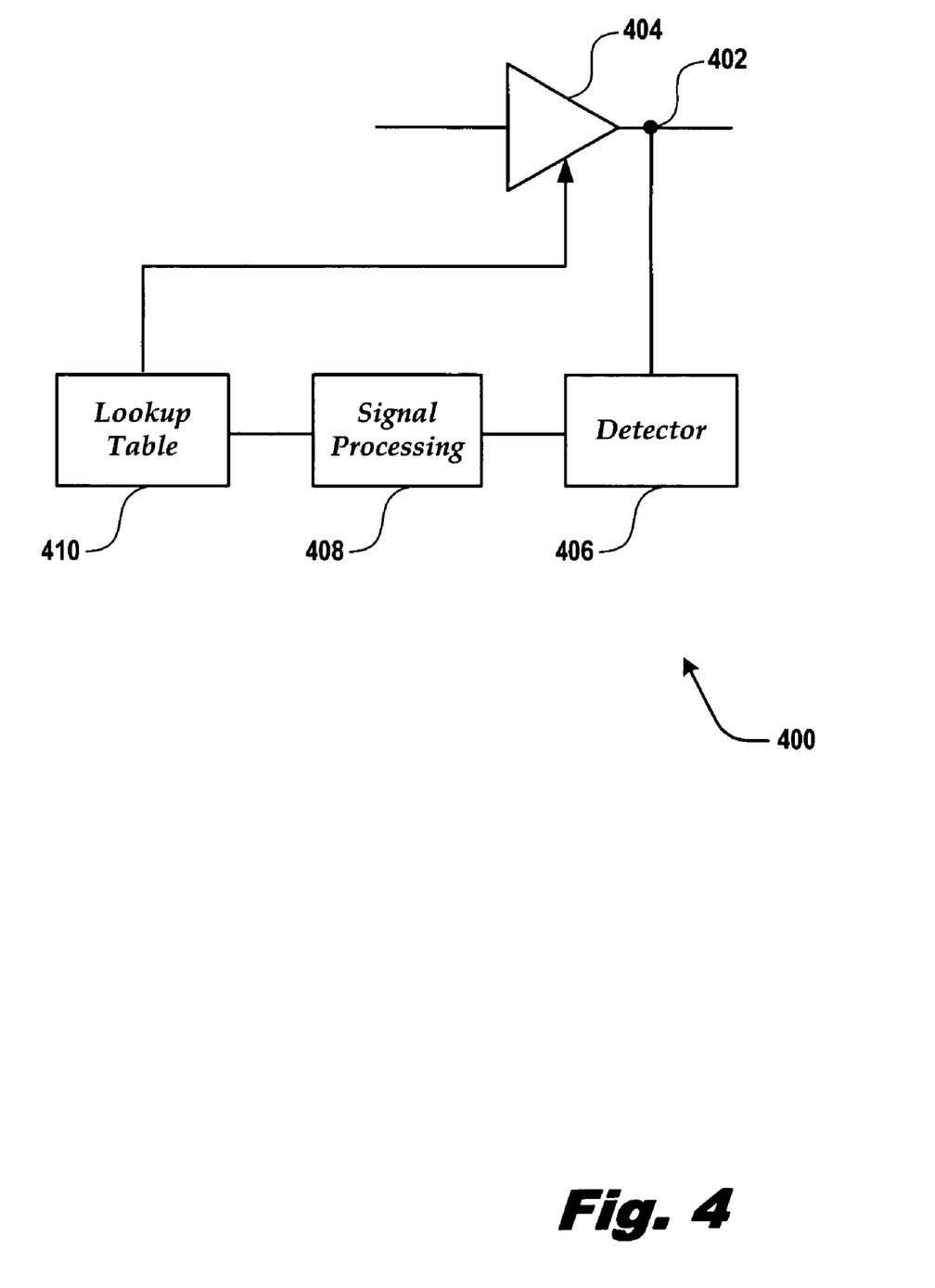
FIG. 4 is a block diagram illustrating some of the functional blocks of a circuit, in accordance with various embodiments of this invention.

FIG. 4 is a block diagram illustrating some of the functional blocks of circuit 400, in accordance with various embodiments of this invention. Circuit 400 may include such components as amplifier 404, detector 406, signal processing circuit 408, and lookup table 410. In various embodiments, detector 406 may be coupled to a node in a signal path of the communications signal, such as node 402. Detector 406 may be designed to detect another one or more measured metrics of the communications signal after its amplification. In various embodiments, detector 406 may be a receiver configured in a loop-back fashion, such as, for example, detector 406 representing a low noise amplifier (LNA)/down-conversion mixer. In various embodiments, detector 406 may represent detection circuitry other than a receiver.

Signal processing circuit 408 may be coupled to detector 406. Signal processing circuit 408 may be coupled to lookup table 410. Signal processing circuit 408 may be designed to provide one or more lookup table values to update lookup table 410, based at least in part on the another one or more measured metrics detected. In various embodiments, signal processing circuit 408 may be designed to generate the one or more lookup table values to optimize at least one characteristic of the communications signal. In some embodiments, signal processing circuit 408 may be designed to generate the one or more lookup table values to reduce or minimize the Error Vector Magnitude (EVM) of amplifier 404. In some embodiments, signal processing circuit 408 may be designed to generate the one or more lookup table values to reduce or minimize power in at least one adjacent channel to a current transmission channel. In various embodiments, signal processing circuit 408 may be designed to generate the one or more lookup table values to additionally or alternatively optimize another characteristic of the communications signal In various embodiments, detector 406 and signal processing circuit 408 may be designed to operate on a test communications signal supplied to amplifier 404 in an off-line mode. An off-line mode may include supplying a test signal to amplifier 404 during idle time between operational reception/transmission. An off-line mode may include supplying a test signal to amplifier 404 during power-up. An off-line mode may additionally or alternatively include supplying a signal to amplifier 404 under other circumstances. In various embodiments, detector 406 and signal processing circuit 408 may be designed to operate on a communications signal supplied to amplifier 404 in an on-line mode. An on-line mode may include generating the one or more lookup table values during standard operation of amplifier 404. An on-line mode may additionally or alternatively include supplying a signal to amplifier 404 under other circumstances. Circuit 400 may be designed to operate both in off-line mode and on-line mode. In various embodiments, the symbol used for amplifier 404 may include a driver to amplifier 404. In some such embodiments, the control signal may be supplied to such a driver. In various embodiments, amplifier 404 may be replaced by another analog circuit, such as a mixer for example, with the remaining functional blocks of FIG. 4 operating in similar fashion as described above.

Figure 5:
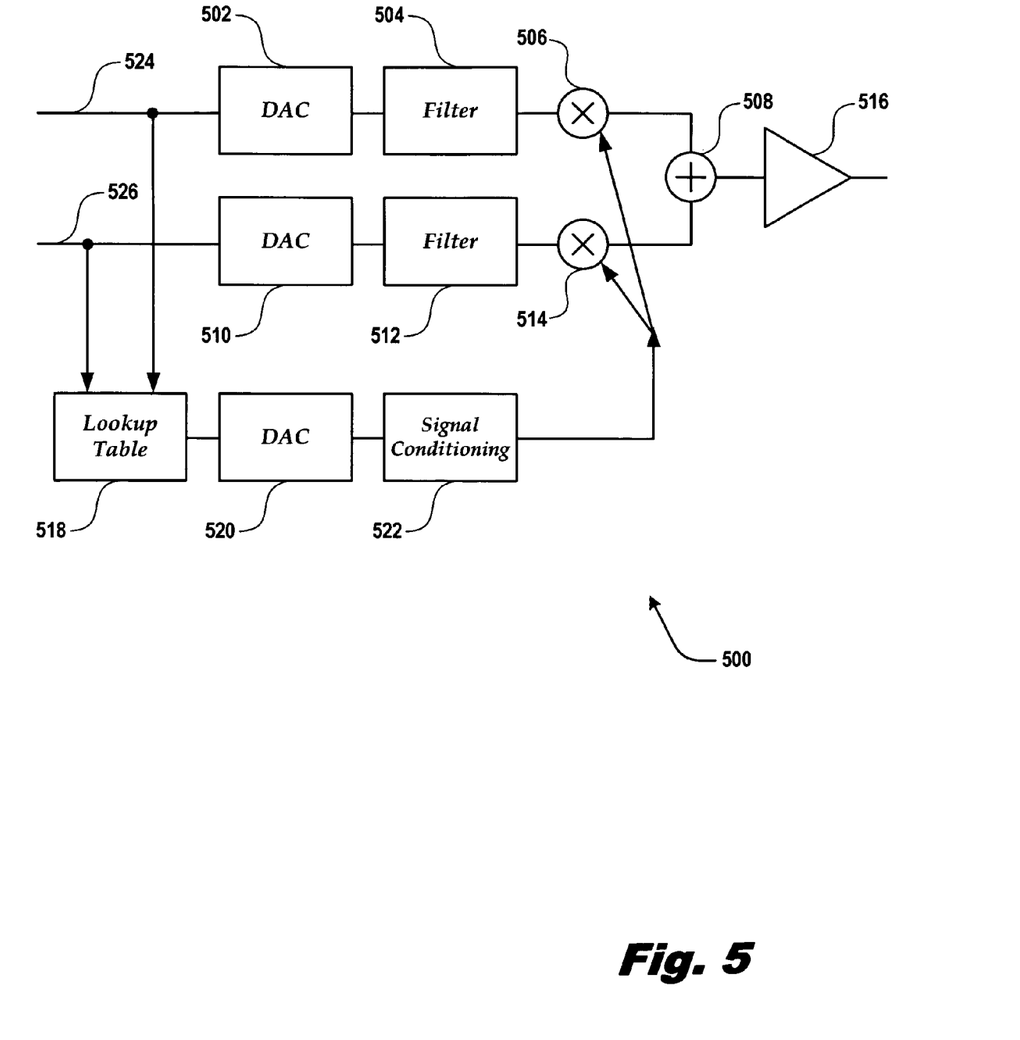
FIG. 5 is a block diagram illustrating some of the functional blocks of a circuit, in accordance with various embodiments of this invention.

FIG. 5 is a block diagram illustrating some of the functional blocks of circuit 500, in accordance with various embodiments of this invention. As illustrated, circuit 500 may comprise some functional blocks of a transmitter and may include such components as DACs 502 and 510, filters 504 and 512, mixers 506 and 514, and adder 508. Circuit 500 may include signal paths 524 and 526. In various embodiments, a different number of signal paths than as illustrated in FIG. 5 may be present. Signal paths 524 and 526 may relay one or more digital representations of a communications signal to be transmitted. In various embodiments, one signal path may relay the I portion of the communications signal and one signal path may relay the Q portion of the communications signal. In other embodiments, the one or more signal paths may relay different representations of the communications signal.

Mixer 506 may serve to mix a baseband signal, which may at least partially be represented by the signal being relayed by signal path 524, with a carrier signal (not shown). Mixer 514 may likewise serve to mix a baseband signal, which may at least partially be represented by the signal being relayed by signal path 526, with a carrier signal (not shown). Adder 508 may serve to combine the two input signals being relayed by signal paths 524 and 526, after said mixing by mixers 506 and 514, respectively, into one signal to be amplified by amplifier 516.

Circuit 500 may include such components as lookup table 518, DAC 520, and signal conditioning circuit 522. While certain components have identical designations in FIG. 5, it is not implied that such components are identical, although they may be in some embodiments. Lookup table 518 may be coupled to one or more analog circuits of circuit 500, such as mixer 506 and/or mixer 514. In various other embodiments, lookup table 518 may be coupled to one or more other analog circuits of circuit 500, including, but not limited to, DAC 502, DAC 510, filter 504, filter 512, adder 508, and/or amplifier 516. Lookup table 518 may be designed to output a control signal to one or more analog circuits of circuit 500, such as mixers 506 and 514 as illustrated in FIG. 5, based at least in part on a digital representation of the communications signal, or one or more measured metrics of the communications signal. In various embodiments, lookup table 518 may be designed to output a control signal to one or more other analog circuits of circuit 500.

In various embodiments, lookup table 518 may receive as inputs, or as one input, a digital I/Q representation of the communications signal. In some embodiments, only a portion of the bits of a digital I or Q may be used in conjunction with lookup table 518. I and Q are used herein to mean both the entire representation of I and Q, respectively, or a portion of a representation of I and Q. In some embodiments, for example, a portion of a representation of I and Q may take the form of a certain number of the MSBs of I and Q. In some embodiments, a portion of a representation of I and Q may take a different form.

In some embodiments, lookup table 518 may receive, or itself determine, a function of I and Q, such as, for example, the square root of $(I^2+Q^2)$. In some embodiments, lookup table 518 may receive, or itself determine, a different function of I and Q. In some embodiments, lookup table 518 may receive a function of additional or alternative values. In various other embodiments, lookup table 518 may receive a different digital representation of the communications signal as an input. In various other embodiments, lookup table 518 may receive an analog representation of the communications signal as an input. The contents of lookup table 518 may be determined in a number of ways, such as, for example, during the design stage of circuit 500, or portions of circuit 500, using simulations. In various embodiments, the contents of lookup table 518 may be static. In various embodiments, the contents of lookup table 518 may be dynamic, such as shown in the illustrative embodiment of FIG. 4.

In various embodiments, DAC 520 may be coupled to the output of lookup table 518 in order to convert a digital output of lookup table 518 into analog form. In various embodiments, signal conditioning circuit 522 may facilitate the coupling of DAC 520 and mixers 506 and 514. In various embodiments, signal conditioning circuit 522 may facilitate the coupling of lookup table 518 and mixers 506 and 514. In some embodiments, signal conditioning circuit 522 may delay the signal supplied to its input to ensure proper timing of the application of the control signal to mixers 506 and 514. In some embodiments, signal conditioning circuit 522 may additionally or alternatively smooth the signal supplied to its input, and may at least partially eliminate high frequency components. In some embodiments, signal conditioning circuit 522 may additionally or alternatively perform different signal conditioning functions on the signal supplied to its input. In some embodiments, signal conditioning circuit 522 may comprise a substantially similar filter as either filter 504 or 512, including comprising the same filter as either filter 504 or 512. In some embodiments, filters 504 and 512, and signal conditioning circuit 522, may comprise identical filters.

In various embodiments, the control signal supplied to mixers 506 and 514 may comprise a bias control signal, such as, for example, a bias current or voltage. In some such embodiments, the bias control signal may be supplied to one or more field effect transistors (FETs) of mixers 506 and 514. In various embodiments, the control signal supplied to mixers 506 and 514 may comprise another type of control signal. In various embodiments, mixers 506 and 514 may comprise Gilbert mixers. In various embodiments, mixers 506 and 514 may comprise mixers other than Gilbert mixers.

Figure 6:
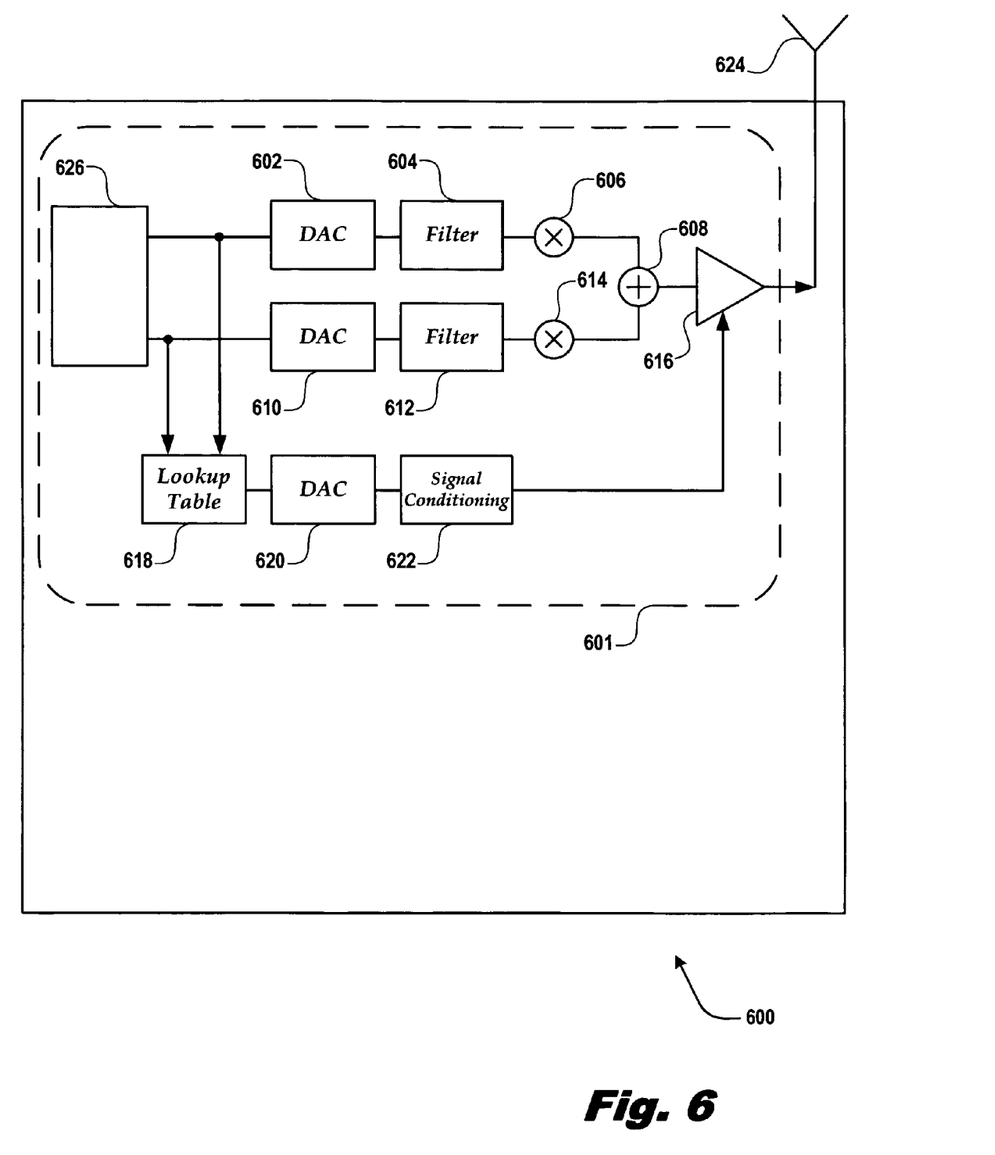
FIG. 6 is a block diagram illustrating some of the functional blocks of a communications system, in accordance with various embodiments of this invention.

FIG. 6 is a block diagram illustrating some of the functional blocks of communications system 600, in accordance with various embodiments of this invention. Communications system 600 may include components such as DAC 602, filter 604, and mixer 606, corresponding to DAC 102, filter 104, and mixer 106, of FIG. 1. Communications system 600 may include components such as DAC 610, filter 612, and mixer 614, corresponding to DAC 110, filter 112, and mixer 114, of FIG. 1. Communications system 600 may include a component such as adder 608, corresponding to adder 108, of FIG. 1. Communications system 600 may include components such as lookup table 618 and amplifier 616, corresponding to lookup table 118 and amplifier 116 of FIG. 1. Communications system 600 may include a component such as DAC 620, corresponding to DAC 120 of FIG. 1. Communications system 600 may include a component such as signal conditioning circuit 622, corresponding to signal conditioning circuit 122 of FIG. 1. While certain components have identical designations in FIG. 5, it is not implied that such components are identical, although they may be in some embodiments. At least some of the above described components of FIG. 6 may be coupled together to form circuit 601. Components of FIG. 6 corresponding to components of FIG. 1 may operate in the same manner and interrelate to one another as their corresponding components in FIG. 1. In various embodiments, communications system 600 may include components not included in FIG. 1. In various embodiments, communications system 600 may not include components included in FIG. 1.

In various embodiments, communications system 600 may include one or more substantially omnidirectional antenna (e), represented by antenna 624, with at least one of the one or more substantially omnidirectional antenna(e) coupled to amplifier 616 and designed to at least facilitate the wireless transmission of a communications signal. In some embodiments, communications system 600 may include one such antenna. In other embodiments, communications system 600 may include two or more such antennae to, for example, provide a spatial division multiple access (SDMA) system or a multiple input, multiple output (MIMO) system. In various embodiments, one or more of the one or more substantially omnidirectional antennae may comprise a dipole antenna. In various other embodiments, a dipole antenna may not be used. In various embodiments, different types of substantially omnidirectional antennae may be used, including different types of antennae for the same communications system.

In various embodiments, communications system 600 may include controller 626 coupled to circuit 601 to operate the circuit to transmit, in conjunction with antenna 624, a communications signal in accordance with an orthogonal frequency division multiplexing (OFDM) protocol. In various embodiments, communications system 600 may include controller 626 coupled to circuit 601 to additionally or alternatively operate circuit 601 to transmit, in conjunction with antenna 624, a communications signal in accordance with another transmission protocol. In various embodiments, communications system 600 may comprise or be integrated in any number of electronic devices to augment the electronic devices' abilities. Such electronic devices may include, for example, a personal computer, a notebook computer, a set-top box, a game console, a video display, a digital versatile disk (DVD) player, a home entertainment console, a cellular phone, a personal digital assistant, a handheld gaming device, a video display device, a video camera and the like.

Thus, it can be seen from the above description, an apparatus for transmitter control is disclosed. The apparatus includes an analog circuit designed to operate on at least a portion of a communications signal to be wirelessly transmitted, based at least in part on a control signal. The apparatus includes a lookup table coupled to the analog circuit, with the lookup table designed to output the control signal based at least in part on the communications signal, or one or more measured metrics of the communications signal. Embodiments of the present invention include, but are not limited to, methods encompassing the operations described above, as well as subsystems and systems designed to operate in the above described manner. While the present invention has been described in terms of the foregoing embodiments, those skilled in the art will recognize that the invention is not limited to the embodiments described. Other embodiments may be practiced with modification and alteration within the spirit and scope of the appended claims. Accordingly, the description is to be regarded as illustrative instead of restrictive.

What is claimed is:

1. A circuit comprising:
    an amplifier designed to amplify a communications signal to be wirelessly transmitted, based at least in part on a control signal;
    a lookup table coupled to the amplifier, and designed to receive a digital input that corresponds to I/O digital components of the communication signal prior to amplification or to a measured metric of the communications signal after amplification, wherein the measured metric of the communications signal includes power associated with output of the amplifier, the lookup table further designed to provide the control signal based at least in part on the digital input;
    an equalizer coupled to the lookup table, and designed to compensate for at least phase shift and gain of a signal path of the communications signal; and
    a signal conditioning circuit coupling the lookup table to the amplifier, the signal conditioning circuit designed to at least smooth the control signal before the control signal is supplied to the amplifier.

2. The circuit of claim 1, further comprising
    an analog-to-digital converter coupled to an input of the lookup table, the analog-to-digital converter designed to supply the measured metric of the communications signal to the lookup table.

3. The circuit of claim 2, further comprising
    a measurement circuit coupled to the analog-to-digital converter and designed to supply the analog-to-digital converter the measured metric of the communications signal in analog form.

4. The circuit of claim 1, further comprising a digital-to-analog converter to facilitate the coupling of the lookup table and the amplifier, the digital-to-analog converter designed to convert the control signal from a digital form to an analog form.

5. The circuit of claim 1, wherein the signal conditioning circuit is further designed to delay the control signal.

6. The circuit of claim 1, wherein the control signal comprises a bias control signal.

7. The circuit of claim 1, further comprising
    a detector coupled to a node in a signal path of the communications signal, the detector designed to detect another one or more measured metrics of the communications signal after its amplification; and
    a signal processing circuit, the signal processing circuit coupled to the detector and to the lookup table, the signal processing circuit designed to provide one or more lookup table values, to update the lookup table, based at least in part on the another one or more measured metrics detected.

8. The circuit of claim 7, wherein the signal processing circuit is designed to generate the one or more lookup table values to optimize at least one characteristic of the communications signal.

9. The circuit of claim 8, wherein said optimizing comprises one or more selected ones from the group consisting of reducing or minimizing an error vector magnitude, and reducing or minimizing power in at least one adjacent channel to a transmission channel.

10. The circuit of claim 7, wherein the detector and the signal processing circuit are designed to operate on a test communications signal in an off-line mode.

11. The circuit of claim 7, wherein the detector and the signal processing circuit are designed to operate on the communications signal while in an on-line mode.

12. A transmitter comprising:
an analog circuit designed to operate on at least a portion of a communications signal to be wirelessly transmitted, based at least in part on a control signal;
a lookup table coupled to the analog circuit, and designed to output the control signal based at least in part on a digital representation of the communications signal, or one or more measured metrics of the communications signal, wherein the one or more measured metrics of the communications signal include power associated with output of the analog circuit;
an equalizer coupled to the lookup table, and designed to compensate for at least phase shift and gain of a signal path of the communications signal; and
a signal conditioning circuit coupling the lookup table to the amplifier, the signal conditioning circuit designed to at least smooth the control signal before the control signal is supplied to the amplifier.

13. The transmitter of claim 12, further comprising a digital-to-analog converter to facilitate the coupling of the lookup table and the analog circuit, the digital-to-analog converter designed to convert the control signal from a digital form to an analog form.

14. The transmitter of claim 12, further comprising
a detector coupled to a node in a signal path of the communications signal, the detector designed to detect another one or more measured metrics of the communications signal; and
a signal processing circuit, the signal processing circuit coupled to the detector and to the lookup table, the signal processing circuit designed to provide one or more lookup table values, to update the lookup table, based at least in part on the another one or more measured metrics detected.

15. The transmitter of claim 12, wherein the analog circuit comprises a selected one from the group consisting of an amplifier, a mixer, a filter, and a digital-to-analog converter.

16. A method comprising:
generating, by a lookup table, a control signal based at least in part on a communications signal to be wirelessly transmitted, the generating being prior to its amplification of the communications signal, or one or more measured metrics of the communications signal, the generating being after amplification of the communications signal, wherein the one or more measured metrics of the communications signal includes power associated with an output of an amplifier;
performing equalization, by an equalizer coupled to the lookup table, on the control signal to compensate for at least phase shift and gain of a signal path of the communications signal;
conditioning the control signal, wherein said conditioning comprises at least smoothing the control signal; and
amplifying the communications signal with the amplifier, based at least in part on the control signal.

17. The method of claim 16, further comprising providing one or more digital representations of the communications signal prior to its amplification, or the one or more measured metrics of the communications signal, as inputs to the lookup table.

18. The method of claim 16, further comprising
converting the one or more measured metrics from an analog form to a digital form.

19. The method of claim 16, wherein the method further comprises converting the control signal from a digital form to an analog form.

20. The method of claim 16, further comprising providing the conditioned control signal to the amplifier.

21. The method of claim 16, further comprising
detecting another one or more measured metrics of the communications signal, from a node in a signal path of the communications signal;
performing signal processing on the another one or more measured metrics detected; and
updating one or more values of the lookup table based at least in part on the result(s) of said signal processing.

22. The method of claim 21, further comprising selecting the one or more values from the result(s) of the signal processing, to optimize at least one characteristic of the communications signal.

23. A communications system comprising:
a circuit, the circuit including
an amplifier to amplify a communications signal to be wirelessly transmitted, based at least in part on a control signal;
a lookup table coupled to the amplifier, and designed to output the control signal based at least in part on the communications signal prior to amplification of the communications signal, or one or more measured metrics of the communications signal after amplification of the communications signal, wherein the one or more measured metrics of the communications signal comprise rower associated with output of the amplifier;
an equalizer coupled to the lookup table, and designed to compensate for at least phase shift and gain of a signal path of the communications signal;
a signal conditioning circuit coupling the lookup table to the amplifier, the signal conditioning circuit designed to at least smooth the control signal before the control signal is supplied to the amplifier; and
one or more substantially omnidirectional antenna(e), at least one of the one or more substantially omnidirectional antenna(e) coupled to the amplifier and designed to at least facilitate wireless transmission of the communications signal.

24. The communications system of claim 23, further comprising a controller coupled to the circuit to operate the circuit to wirelessly transmit the communications signal in accordance with an orthogonal frequency division multiplexing protocol.

25. The communications system of claim 23, wherein the communications system comprises a selected one from the group consisting of a cellular phone, a personal digital assistant, a hand held gaming device, a video display device, and a video camera.

* * * * *

UNITED STATES PATENT AND TRADEMARK OFFICE
CERTIFICATE OF CORRECTION

PATENT NO.       : 7,653,147 B2
APPLICATION NO.  : 11/206447
DATED            : January 26, 2010
INVENTOR(S)      : Palaskas et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1134 days.

Signed and Sealed this

Twenty-third Day of November, 2010

David J. Kappos
*Director of the United States Patent and Trademark Office*